United States Patent
Meng et al.

(10) Patent No.: US 11,449,729 B2
(45) Date of Patent: Sep. 20, 2022

(54) EFFICIENT CONVOLUTIONAL NEURAL NETWORKS

(71) Applicant: Arm Limited, Cambridge (GB)

(72) Inventors: Lingchuan Meng, Santa Clara, CA (US); Danny Daysang Loh, Menlo Park, CA (US); Ian Rudolf Bratt, Portola Valley, CA (US); Alexander Eugene Chalfin, Mountain View, CA (US); Tianmu Li, Los Angeles, CA (US)

(73) Assignee: Arm Limited, Cambridge (GB)

( * ) Notice: Subject to any disclaimer, the term of this patent is extended or adjusted under 35 U.S.C. 154(b) by 491 days.

(21) Appl. No.: 16/676,757

(22) Filed: Nov. 7, 2019

(65) Prior Publication Data

US 2020/0151541 A1    May 14, 2020

Related U.S. Application Data

(60) Provisional application No. 62/757,525, filed on Nov. 8, 2018.

(51) Int. Cl.
*G06N 3/04* (2006.01)
*G06N 3/06* (2006.01)
(Continued)

(52) U.S. Cl.
CPC ............... *G06N 3/04* (2013.01); *G06F 17/15* (2013.01); *G06F 17/16* (2013.01); *G06F 30/18* (2020.01);
(Continued)

(58) Field of Classification Search
CPC .......... G06F 17/15; G06F 17/16; G06F 30/18; G06F 30/20; G06F 30/27; G06F 30/33;
(Continued)

(56) References Cited

U.S. PATENT DOCUMENTS

2018/0211303 A1 *  7/2018  Chatwin ................ G06N 20/00
2018/0218260 A1 *  8/2018  Brand ..................... G06N 3/08
(Continued)

FOREIGN PATENT DOCUMENTS

CN    107844828 A  *  3/2018  ............. G06F 17/15
CN    108108811 A  *  6/2018  ............. G06F 17/15

OTHER PUBLICATIONS

Xygkis, A., Soudris, D., Papadopoulos, L., Yous, S. and Moloney, D., "Efficient Winograd-based Convolution Kernel Implementation on Edge Devices," 2018 55th ACM/ESDA/IEEE Design Automation Conference (DAC), San Francisco, DA, 2018, pp. 1-6.
(Continued)

*Primary Examiner* — Phallaka Kik
(74) *Attorney, Agent, or Firm* — Leveque Intellectual Property Law, P.C.

(57) ABSTRACT

The present disclosure advantageously provides a system and a method for convolving data in a quantized convolutional neural network (CNN). The method includes selecting a set of complex interpolation points, generating a set of complex transform matrices based, at least in part, on the set of complex interpolation points, receiving an input volume from a preceding layer of the quantized CNN, performing a complex Winograd convolution on the input volume and at least one filter, using the set of complex transform matrices, to generate an output volume, and sending the output volume to a subsequent layer of the quantized CNN.

20 Claims, 6 Drawing Sheets

(51) Int. Cl.
| | |
|---|---|
| *G06N 3/08* | (2006.01) |
| *G06N 3/10* | (2006.01) |
| *G06F 17/15* | (2006.01) |
| *G06F 17/16* | (2006.01) |
| *G06F 17/18* | (2006.01) |
| *G06F 30/18* | (2020.01) |
| *G06F 30/20* | (2020.01) |
| *G06F 30/27* | (2020.01) |
| *G06F 30/33* | (2020.01) |
| *G06F 30/367* | (2020.01) |

(52) U.S. Cl.
CPC .............. *G06F 30/20* (2020.01); *G06F 30/27* (2020.01); *G06F 30/33* (2020.01); *G06F 30/367* (2020.01); *G06N 3/0445* (2013.01); *G06N 3/0454* (2013.01); *G06N 3/06* (2013.01); *G06N 3/08* (2013.01); *G06N 3/10* (2013.01)

(58) Field of Classification Search
CPC ......... G06F 30/367; G06F 19/00; G06N 3/04; G06N 3/0445; G06N 3/0454; G06N 3/06; G06N 3/08; G06N 3/10
USPC ........ 706/15; 703/6, 2, 1; 702/109; 716/136, 716/106, 111
See application file for complete search history.

(56) References Cited

U.S. PATENT DOCUMENTS

| | | | |
|---|---|---|---|
| 2019/0138902 A1* | 5/2019 | Matveev | G06V 10/82 |
| 2019/0179869 A1* | 6/2019 | Park | G06N 3/02 |
| 2019/0205735 A1* | 7/2019 | Smelyanskiy | G06F 17/16 |

OTHER PUBLICATIONS

Barabasz, B., Anderson, A. and Gregg, D., "Improving the Accuracy of Winograd Convolution for Deep Neural Networks," CoRR, abs/1803.10986, 2018.
Budden, D., Matveev, A., Santurkar, S., Chaudhuri, S. and Shavit, N., "Deep Tensor Convolution on Multicores," CoRR, abs/1611.06565, 2016.
Cai, H., Zhu, L. and Han, S., "ProxylessNAS: Direct Neural Architecture Search on Target Task and Hardware," ICLR 019, 2018.
"Gemmlowp: a small self-contained low-precision GEMM library," URL https://github.com/google/gemmlowp (visited Dec. 13, 2019).
Han, S., Liu, X., Mao, H., Pu, J., Pedram, A., Horowitz, M., and Dally, W., "EIE: Efficient Inference Engine on Compressed Deep Neural Network," CoRR, abs/1602.01528, 2016.
Han, S., Mao, H. and Dally, W., "Deep Compression: Compressing Deep Neural Network with Pruning, Trained Quantization and Human Coding," CoRR, abs/1510.00149, 2015.
Jia, Z., Zlateski, A., Durand, F. and Li, K., "Optimizing N-Dimensional, Winograd-Based Convolution for Manycore CPUs," SIGPLAN Not., 53(1):109-123, Feb. 2018.
Krishnamoorthi, R., "Quantizing deep convolutional networks for efficient inference: A whitepaper," ArXiv e-prints, Jun. 2018.
Krizhevsky, A., Sutskever, I. and Hinton, G., "ImageNet Classification with Deep Convolutional Neural Networks," Proceedings of the 25th International Conference on Neural Information Processing Systems—vol. 1, NIPS'12, pp. 1097-1105, 2012.
Lai, L., Suda, N. and Chandra, V., "CMSIS-NN: Efficient Neural Network Kernels for Arm Cortex-M CPUs," CoRR, abs/1801.06601, 2018.
Russakovsky et al., "ImageNet Large Scale Visual Recognition Challenge," arXiv:1409.0575 (2014).
Li, S., Park, J. and Tang, P., "Enabling Sparse Winograd Convolution by Native Pruning," CoRR, abs/1702.08597, 2017.
Liu, X., Pool, J., Han, S. and Dally, W. J., "Efficient Sparse-Winograd Convolutional Neural Networks," CoRR, abs/1802.06367, 2018.
Mathieu, M., Hena, M. and LeCun, Y., "Fast Training of Convolutional Networks through FFTs," CoRR, abs/1312.5851, 2013.
Meng, L. and Brothers, J., "Efficient Winograd Convolution via Integer Arithmetic," arXiv:1901.01965, 2019.
Migacz, S., "8-bit Inference with TensorRT," URL http://on-demand.gputechconf.com/gtc/2017/presentation/s7310-8-bit-inference-with-tensorrt.pdf (visited Dec. 5, 2019).
"NVIDIA Deep Learning Accelerator," URL http://http://nvdla.org/ (visited Dec. 13, 2019).
Williams, S., Patterson, D., Oliker, L., Shalf J. and Yelick K., "The Roofline Model: A pedagogical tool for program analysis and optimization," 2008 IEEE Hot Chips 20 Symposium (HCS), Stanford, CA, 2008, pp. 1-71.
Sze, V., Chen, Y., Yang, T. and Emer, J., "Efficient Processing of Deep Neural Networks: A Tutorial and Survey," CoRR, abs/1703.09039, 2017.
Szegedy, C., Vanhoucke, V., Ioffe, S., Shlens, J. and Wojna, Z., "Rethinking the Inception Architecture for Computer Vision," CoRR, abs/1512.00567, 2015.
Vasilache, N., Johnson, J., Mathieu, M., Chintala, S., Piantino, S. and Le-Cun, Y., "Fast Convolutional Nets With fbfft: A GPU Performance Evaluation," CoRR, abs/1412.7580, 2014.
Vincent, K., Stephano, K., Michael, F., Boris, G. and Julien, D., "On Improving the Numerical Stability of Winograd Convolutions," 5th International Conference on Learning Representations, 2017.
Warden, P., "Implementing the TensorFlow Deep Learning Framework on Qualcomm's Low-power DSP," 2017, URL https://www.embedded-vision.com/platinum-members/embedded-vision-alliance/embedded-vision-training/videos/pages/may-2017-embedded-vision-summit-warden (visited Dec. 13, 2019).
Warden, P., "Why are Eight Bits Enough for Deep Neural Networks?," URL https://petewarden.com/2015/05/23/why-are-eight-bits-enough-for-deep-neural-networks/, May 23, 2015 (visited Dec. 13, 2019).
Zlateski, A., Jia, Z., Li, K. and Durand, F., "A Deeper Look at FFT and Winograd Convolutions," URL https://www.semanticscholar.org/paper/A-Deeper-Look-at-FFT-and-Winograd-Convolutions-Zlateski-Jia/dffa772015223203c57804710d255424094bcf99, No date.
Blahut, R., "Fast Algorithms for Signal Processing," Cambridge University Press, 2010.
Lavin et al., "Fast Algorithms for Convolutional Neural Networks," https://arxiv.org/abs/1509.09308v2, CoRR, abs/1509.09308, Nov. 10, 2015.

\* cited by examiner

$$B^T = \begin{bmatrix} 1 & 0 & 0 & 0 & -1 & 0 \\ 0 & 1 & 1 & 1 & 1 & 0 \\ 0 & -1 & 1 & -1 & 1 & 0 \\ 0 & -i & -1 & i & 1 & 0 \\ 0 & i & -1 & -i & 1 & 0 \\ 0 & -1 & 0 & 0 & 0 & 1 \end{bmatrix}$$

404 —

$$G = \begin{bmatrix} 1 & 0 & 0 \\ \frac{1}{4} & \frac{1}{4} & \frac{1}{4} \\ \frac{1}{4} & -\frac{1}{4} & \frac{1}{4} \\ \frac{1}{4} & \frac{i}{4} & -\frac{1}{4} \\ \frac{1}{4} & -\frac{i}{4} & -\frac{1}{4} \\ 0 & 0 & 1 \end{bmatrix}$$

406 —

$$A^T = \begin{bmatrix} 1 & 1 & 1 & 1 & 1 & 0 \\ 0 & 1 & -1 & i & -i & 0 \\ 0 & 1 & 1 & -1 & -1 & 0 \\ 0 & 1 & -1 & -i & i & 1 \end{bmatrix}$$

$$D = \begin{bmatrix} D_{0,0} & D_{0,1} & D_{0,2} & D_{0,3} & \overline{D_{0,3}} & D_{0,5} \\ D_{1,0} & D_{1,1} & D_{1,2} & D_{1,3} & \overline{D_{1,3}} & D_{1,5} \\ D_{2,0} & D_{2,1} & D_{2,2} & D_{2,3} & \overline{D_{2,3}} & D_{2,5} \\ D_{3,0} & D_{3,1} & D_{3,2} & D_{3,3} & D_{3,4} & D_{3,5} \\ \overline{D_{3,0}} & \overline{D_{3,1}} & \overline{D_{3,2}} & \overline{D_{3,4}} & \overline{D_{3,3}} & \overline{D_{3,5}} \\ D_{5,0} & D_{5,1} & D_{5,2} & D_{5,3} & \overline{D_{5,3}} & D_{5,5} \end{bmatrix}$$

410 —

$$W = \begin{bmatrix} W_{0,0} & W_{0,1} & W_{0,2} & W_{0,3} & \overline{W_{0,3}} & W_{0,5} \\ W_{1,0} & W_{1,1} & W_{1,2} & W_{1,3} & \overline{W_{1,3}} & W_{1,5} \\ W_{2,0} & W_{2,1} & W_{2,2} & W_{2,3} & \overline{W_{2,3}} & W_{2,5} \\ W_{3,0} & W_{3,1} & W_{3,2} & W_{3,3} & W_{3,4} & W_{3,5} \\ \overline{W_{3,0}} & \overline{W_{3,1}} & \overline{W_{3,2}} & \overline{W_{3,4}} & \overline{W_{3,3}} & \overline{W_{3,5}} \\ W_{5,0} & W_{5,1} & W_{5,2} & W_{5,3} & \overline{W_{5,3}} & W_{5,5} \end{bmatrix}$$

FIG. 4B

FIG. 5

EFFICIENT CONVOLUTIONAL NEURAL NETWORKS

BACKGROUND

The present disclosure relates to computer systems. More particularly, the present disclosure relates to computer systems that include convolutional neural networks (CNNs).

Convolution is a fundamental component for many important applications that use CNNs, such as image recognition, classification and analysis, voice recognition, natural language processing, autonomous systems, robotic systems, etc. CNNs generally use higher precision numbers, such as single precision floating point numbers, double precision floating point numbers, etc., for model weights and activations. During training and inference, convolution operations within the CNN's convolutional layers are responsible for 90% or more of the computation load. In order to accelerate the processing speed of the convolutional layers, the CNN may be quantized by converting the higher precision weights and activations to lower precision weights and activations, such as integers, fixed point numbers, or reduced precision floating point numbers.

For example, quantizing a higher precision CNN from 32-bit floating point weights and activations to 8-bit integer weights and activations reduces the model size by a factor of 4× and increases performance by a factor of 2× to 3×. For computer systems with coprocessors or hardware accelerators that are optimized for integer or fixed-point calculations, the inference performance may increase by a factor of 10× after quantization.

As noted above, convolution operations are responsible for 90% or more of a CNN's computation load. Different techniques may speed up this core operation, such as Winograd convolutions or fast Fourier transforms (FFTs). The Winograd convolution works particularly well for small convolution sizes, such as 3×3, due to the reduction in arithmetic complexity. However, the Winograd convolution is applied over the field of rational numbers, which produces undesirable overhead when quantized CNNs are implemented on coprocessors or hardware accelerators using integer or fixed point calculations.

DETAILED DESCRIPTION

Embodiments of the present disclosure will now be described with reference to the drawing figures, in which like reference numerals refer to like parts throughout.

Embodiments of the present disclosure advantageously provide a complex Winograd convolution that accelerates convolution layer calculations for a CNN, and, more particularly, for a quantized CNN. Additionally, the number of general multiplications in the complex Winograd convolution have been reduced, which yields an arithmetic reduction of about 3× and an efficiency gain of about 16% to 17% over standard (i.e., non-complex) Winograd convolutions.

In one embodiment, a system includes a memory configured to store input data, a processor coupled to the memory, and a hardware accelerator, coupled to the processor and the memory. The processor is configured to select a set of complex interpolation points, and generate a set of complex transform matrices based, at least in part, on the set of complex interpolation points. The hardware accelerator is configured to receive an input volume from a preceding layer of a quantized convolutional neural network (CNN), perform a complex Winograd convolution on the input volume and at least one filter, using the set of complex transform matrices, to generate an output volume, and send the output volume to a subsequent layer of the quantized CNN.

The input volume includes an input width, an input height, an input depth and a plurality of quantized values. The input depth is equal to a number of input channels. Each filter includes a filter width, a filter height, a filter depth and a plurality of filter values. The output volume includes an output width, an output height, an output depth and a plurality of quantized values. The output depth is equal to the number of filters.

An artificial neural network (ANN) models the relationships between input data or signals and output data or signals using a network of interconnected nodes that is trained through a learning process. The nodes are arranged into various layers, including, for example, an input layer, one or more hidden layers, and an output layer. The input layer receives input data, such as, for example, image data, and the output layer generates output data, such as, for example, a probability that the image data contains a known object. Each hidden layer provides at least a partial transformation of the input data to the output data. A deep neural network (DNN) has multiple hidden layers in order to model complex, nonlinear relationships between input data and output data.

In a fully-connected, feedforward ANN, each node is connected to all of the nodes in the preceding layer, as well as to all of the nodes in the subsequent layer. For example, each input layer node is connected to each hidden layer node, each hidden layer node is connected to each input layer node and each output layer node, and each output layer node is connected to each hidden layer node. Additional hidden layers are similarly interconnected. Each connection has a weight value, and each node has an activation function, such as, for example, a linear function, a step function, a sigmoid function, a tan h function, a rectified linear unit (ReLu) function, etc., that determines the output of the node based on the weighted sum of the inputs to the node. The input data propagates from the input layer nodes, through respective connection weights to the hidden layer nodes, and then through respective connection weights to the output layer nodes.

More particularly, at each input node, input data is provided to the activation function for that node, and the output of the activation function is then provided as an input data value to each hidden layer node. At each hidden layer node, the input data value received from each input layer node is multiplied by a respective connection weight, and the resulting products are summed or accumulated into an activation signal value that is provided to the activation function for that node. The output of the activation function is then provided as an input data value to each output layer node. At each output layer node, the output data value received from each hidden layer node is multiplied by a respective connection weight, and the resulting products are summed or accumulated into an activation signal value that is provided to the activation function for that node. The output of the activation function is then provided as output data. Additional hidden layers may be similarly configured to process data.

Figure 1:
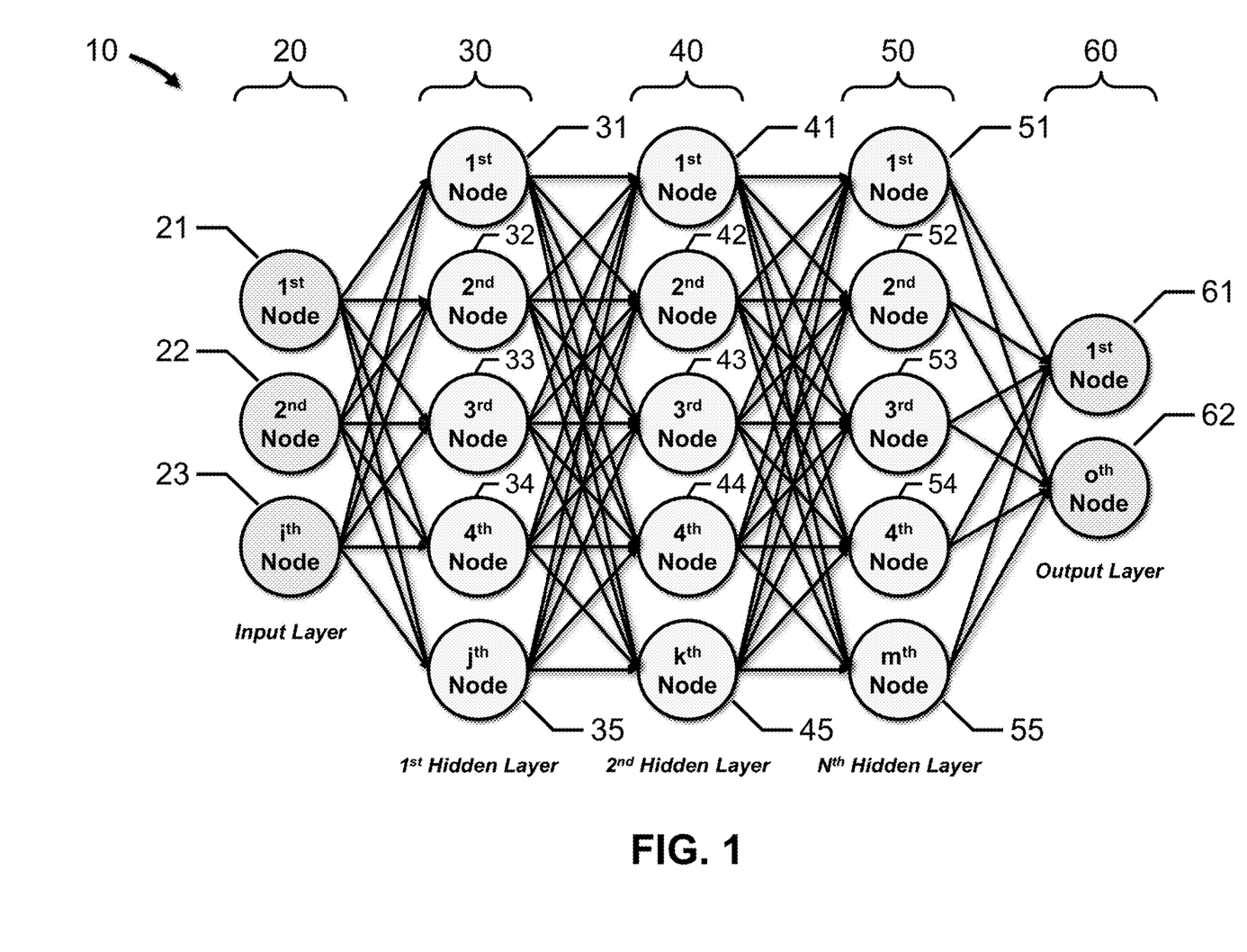
FIG. 1 depicts an artificial neural network (ANN), in accordance with an embodiment of the present disclosure.

FIG. 1 depicts an ANN, in accordance with an embodiment of the present disclosure.

ANN 10 includes input layer 20, one or more hidden layers 30, 40, 50, etc., and output layer 60. Input layer 20 includes one or more input nodes 21, 22, 23, etc. Hidden layer 30 includes one or more hidden nodes 31, 32, 33, 34, 35, etc. Hidden layer 40 includes one or more hidden nodes 41, 42, 43, 44, 45, etc. Hidden layer 50 includes one or more hidden nodes 51, 52, 53, 54, 55, etc. Output layer 60 includes one or more output nodes 61, 62, etc. Generally, ANN 10 includes N hidden layers, input layer 20 includes "i" nodes, hidden layer 30 includes "j" nodes, hidden layer 40 includes "k" nodes, hidden layer 50 includes "m" nodes, and output layer 60 includes "o" nodes.

In one embodiment, N equals 1, i equals 3, j equals 5 and o equals 2 (not depicted in FIG. 1). Input node 21 is coupled to hidden nodes 31 to 35, input node 22 is coupled to hidden nodes 31 to 35, and input node 23 is coupled to hidden nodes 31 to 35. Hidden node 31 is coupled to output nodes 61 and 62, hidden node 32 is coupled to output nodes 61 and 62, hidden node 33 is coupled to output nodes 61 and 62, hidden node 34 is coupled to output nodes 61 and 62, and hidden node 35 is coupled to output nodes 61 and 62.

In another embodiment, N equals 3, i equals 3, j, k and m equal 5 and o equals 2 (depicted in FIG. 1). Input node 21 is coupled to hidden nodes 31 to 35, input node 22 is coupled to hidden nodes 31 to 35, and input node 23 is coupled to hidden nodes 31 to 35. Hidden node 31 is coupled to hidden nodes 41 to 45, hidden node 32 is coupled to hidden nodes 41 to 45, hidden node 33 is coupled to hidden nodes 41 to 45, hidden node 34 is coupled to hidden nodes 41 to 45, and hidden node 35 is coupled to hidden nodes 41 to 45. Hidden node 41 is coupled to hidden nodes 51 to 55, hidden node 42 is coupled to hidden nodes 51 to 55, hidden node 43 is coupled to hidden nodes 51 to 55, hidden node 44 is coupled to hidden nodes 51 to 55, and hidden node 45 is coupled to hidden nodes 51 to 55. Hidden node 51 is coupled to output nodes 61 and 62, hidden node 52 is coupled to output nodes 61 and 62, hidden node 53 is coupled to output nodes 61 and 62, hidden node 54 is coupled to output nodes 61 and 62, and hidden node 55 is coupled to output nodes 61 and 62.

Many other variations of input, hidden and output layers are clearly possible, including hidden layers that are locally-connected, rather than fully-connected, to one another.

Training an ANN includes optimizing the connection weights between nodes by minimizing the prediction error of the output data until the ANN achieves a particular level of accuracy. One method is backpropagation, or backward propagation of errors, which iteratively and recursively determines a gradient descent with respect to the connection weights, and then adjusts the connection weights to improve the performance of the network.

A multi-layer perceptron (MLP) is a fully-connected ANN that has an input layer, an output layer and one or more hidden layers, and uses a non-linear activation function to classify data that is not linearly separable. MLPs may be used for natural language processing applications, such as machine translation, speech recognition, etc. Other ANNs include recursive neural networks (RNNs), long short-term memories (LSTMs), sequence-to-sequence models that include an encoder RNN and a decoder RNN, shallow neural networks, etc.

A CNN is a variation of an MLP that may be used for classification or recognition applications, such as image recognition, speech recognition, etc. A CNN has an input layer, an output layer and multiple hidden layers including convolutional layers, pooling layers, fully-connected layers, and normalization layers. Each convolutional layer applies a sliding dot product or cross-correlation to an input volume, applies an activation function to the results, and then provides the activation or output volume to the next layer. Convolutional layers typically use the ReLu function as the activation function. In certain embodiments, the activation function is provided in a separate layer, e.g., a ReLu layer. A pooling layer reduces the dimensions of the output volume received from the preceding convolutional layer, and may calculate an average or a maximum over small clusters of data, such as, for example, 2×2 matrices. In certain embodiments, a convolutional layer and a pooling layer may form a single layer of a CNN. The fully-connected layers follow the convolutional and pooling layers, and include a flatten layer and a classification layer. The output layer follows the last fully-connected layer, and may include a normalization function.

Figure 2:
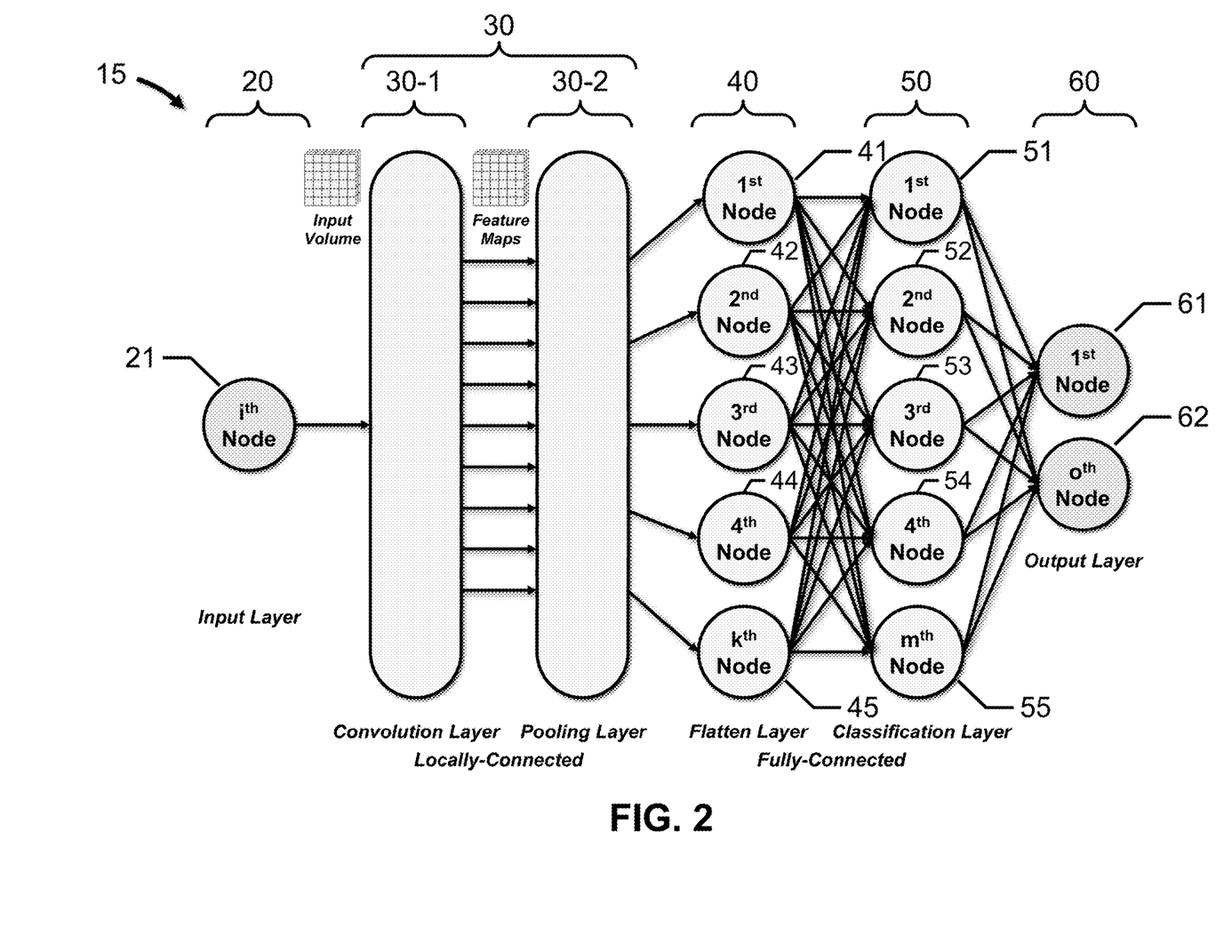
FIG. 2 depicts a CNN, in accordance with an embodiment of the present disclosure.

FIG. 2 depicts a CNN, in accordance with an embodiment of the present disclosure. CNN 15 includes input layer 20, one or more hidden layers, such as convolutional layer 30-1, pooling layer 30-2, flatten layer 40, classification layer 50, etc., and output layer 60. Many other variations of input, hidden and output layers are contemplated.

Input layer 20 includes one or more input nodes 21, etc., that present the input data, such as a color image, as an input volume to the first convolutional layer, e.g., convolutional layer 30-1. The input volume is a three-dimensional matrix that has a width, a height and a depth. For example, input data that represent a color image are presented as an input volume that is 512 pixels×512 pixels×3 channels (red, green, blue); other input volume dimensions may also be used, such as 32×32×3, 64×64×3, 128×128×3, etc., 32×32×1, 64×64×1, 128×128×1, 512×512×1, etc. For a quantized CNN, the precision of the input volume matches the precision of the weights and activations of the quantized CNN, such as integers, fixed point numbers, or reduced precision floating point numbers.

Convolutional layer 30-1 is locally-connected to input layer 20, and includes a plurality of nodes that are connected to local regions in the input volume (not depicted for clarity). For a CNN that uses a standard convolution, each node computes a dot product between the node's weights and the respective local region of the input volume. For a CNN that uses a complex Winograd convolution, discussed in more detail below, each node calculates the results of an optimized series of matrix multiplications. An activation function is then applied to the results of each convolution calculation to produce an output volume that is provided as an input volume to the subsequent layer. The activation function may be applied by each convolutional layer node or by the nodes of a subsequent locally-connected ReLu layer.

Pooling layer 30-2 is locally-connected to convolutional layer 30-1, and includes a plurality of nodes that are connected to local regions in the input volume (not depicted for clarity). Pooling layer 30-2 also produces an output volume that is provided as the input volume to the subsequent layer, such as, for example, another convolutional layer 30-1, a flatten layer 40, etc. Generally, convolutional layer 30-1 and pooling layer 30-2 form a single hidden layer 30. Similarly, in certain embodiments, convolutional layer 30-1, a ReLu layer and pooling layer 30-2 form a single hidden layer 30. Generally, the output volumes of the convolutional and pooling layers may be described as feature maps, and one or more single hidden layers 30 form a feature learning portion of CNN 15.

Hidden layer 40 is a "flatten" layer that is locally-connected to pooling layer 30-2, and includes one or more nodes 41, 42, 43, 44, 45, etc. Hidden (flatten) layer 40 "flattens" the output volume produced by the preceding pooling layer 30-2 into a column vector, which is provided to the subsequent, fully-connected hidden layer 50.

Hidden layer 50 is a classification layer that is fully-connected to hidden (flatten) layer 40, and includes one or more nodes 51, 52, 53, 54, 55, etc.

Output layer 60 includes one or more output nodes 61, 62, etc., and is fully-connected to hidden (classification) layer 50. Fully-connected output layer 60 receives the classification results output by hidden (classification) layer 50, and each node outputs a predicted class score. A normalization function, such as a Softmax function, may be applied to the predicted class scores by output layer 50, or, alternatively, by an additional layer interposed between hidden (classification) layer 50 and output layer 60.

Similar to ANNs, training a CNN includes optimizing the connection weights between nodes by minimizing the prediction error of the output data until the CNN achieves a particular level of accuracy. As noted above, backpropagation may be used to iteratively and recursively determines a gradient descent with respect to the connection weights, and then adjusts the connection weights to improve the performance of the network.

Figure 3:
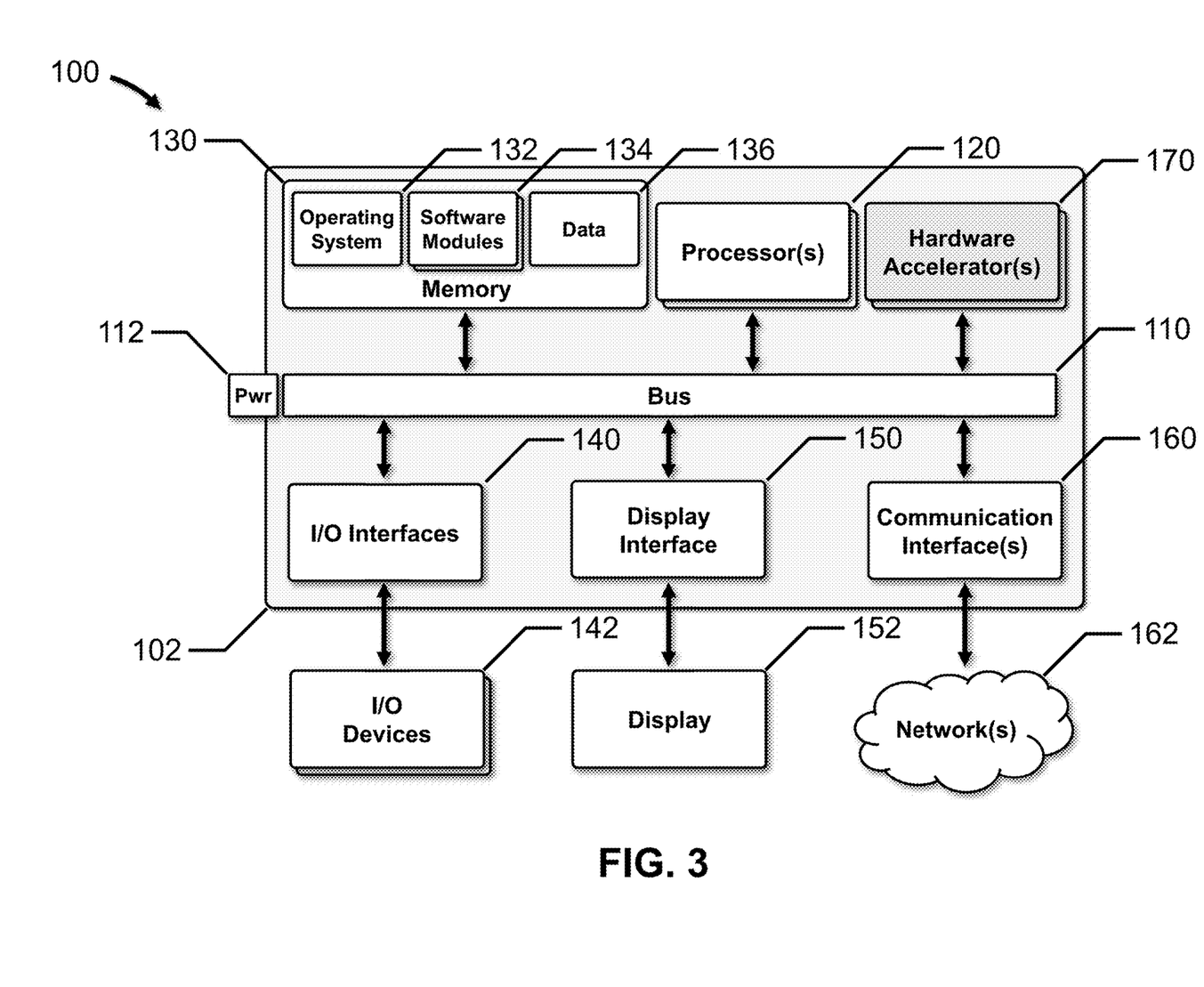
FIG. 3 depicts a block diagram of system, in accordance with an embodiment of the present disclosure.

FIG. 3 depicts a block diagram of system, in accordance with an embodiment of the present disclosure.

Computer 100 includes bus 110 coupled to one or more processors 120, memory 130, I/O interfaces 140, display interface 150, one or more communication interfaces 160 and one or more hardware accelerators 170. Generally, I/O interfaces 140 are coupled to I/O devices 142 using a wired or wireless connection, display interface 150 is coupled to display 152, and communication interface 160 is connected to network 162 using a wired or wireless connection.

Bus 110 is a communication system that transfers data between processor 120, memory 130, I/O interfaces 140, display interface 150, communication interface 160, hardware accelerator 170, as well as other components not depicted in FIG. 1. Power connector 112 is coupled to bus 110 and a power supply (not shown).

Processor 120 includes one or more general-purpose or application-specific microprocessors that executes instructions to perform control, computation, input/output, etc. functions for computer 100. Processor 120 may include a single integrated circuit, such as a micro-processing device, or multiple integrated circuit devices and/or circuit boards working in cooperation to accomplish the functions of processor 120. In addition, processor 120 may execute computer programs or modules, such as operating system 132, software modules 134, etc., stored within memory 130. For example, software modules 134 may include an ML application, an ANN application, a CNN application, etc.

Generally, storage element or memory 130 stores instructions for execution by processor 120 and data. Memory 130 may include a variety of non-transitory computer-readable medium that may be accessed by processor 120. In various embodiments, memory 130 may include volatile and non-volatile medium, non-removable medium and/or removable medium. For example, memory 130 may include any combination of random access memory (RAM), dynamic RAM (DRAM), static RAM (SRAM), read only memory (ROM), flash memory, cache memory, and/or any other type of non-transitory computer-readable medium.

Memory 130 contains various components for retrieving, presenting, modifying, and storing data. For example, memory 130 stores software modules that provide functionality when executed by processor 120. The software modules include operating system 132 that provides operating system functionality for computer 100. Software modules 134 provide various functionality, such as image classification using convolutional neural networks, etc. Data 136 may include data associated with operating system 132, software modules 134, etc.

I/O interfaces 140 are configured to transmit and/or receive data from I/O devices 142. I/O interfaces 140 enable connectivity between processor 120 and I/O devices 142 by encoding data to be sent from processor 120 to I/O devices 142, and decoding data received from I/O devices 142 for processor 120. Generally, data may be sent over wired and/or wireless connections. For example, I/O interfaces 140 may include one or more wired communications interfaces, such as USB, Ethernet, etc., and/or one or more wireless communications interfaces, coupled to one or more antennas, such as WiFi, Bluetooth, cellular, etc.

Generally, I/O devices 142 provide input to computer 100 and/or output from computer 100. As discussed above, I/O devices 142 are operably connected to computer 100 using a wired and/or wireless connection. I/O devices 142 may include a local processor coupled to a communication interface that is configured to communicate with computer 100 using the wired and/or wireless connection. For example, I/O devices 142 may include a keyboard, mouse, touch pad, joystick, etc.

Display interface 150 is configured to transmit image data from computer 100 to monitor or display 152.

Communication interface 160 is configured to transmit data to and from network 162 using one or more wired and/or wireless connections. Network 162 may include one or more local area networks, wide area networks, the Internet, etc., which may execute various network protocols, such as, for example, wired and/or wireless Ethernet, Bluetooth, etc. Network 162 may also include various combinations of wired and/or wireless physical layers, such as, for example, copper wire or coaxial cable networks, fiber optic networks, Bluetooth wireless networks, WiFi wireless networks, CDMA, FDMA and TDMA cellular wireless networks, etc.

Hardware accelerator 170 is configured to execute classification-based machine learning models, such as, for example, ANNs, CNNs, RNNs, SVM, Naïve Bayes etc., in support of software modules 134. Generally, hardware accelerator 170 may be a graphics processing unit (GPU), a digital signal processor (DSP), a neural processing unit (NPU), such as, for example, the ARM Machine Learning Processor or a custom-designed processing engine executing the underlying ML inference algorithm. Hardware accelerator 170 may also be an application-specific integrated circuit (ASIC), or a custom processor implemented onto a field-programmable gate array (FPGA), etc. Accordingly, hardware accelerator 170 may include one or more processors, microprocessors, microcontrollers, etc., one or more memory blocks including RAM, ROM, EEPROM, flash memory, etc., integrated circuits, programmable circuits, matrix multiply accelerators, etc. For example, hardware accelerator 170 may include an N×N systolic array of multiply and accumulate (MAC) cells and supporting memory registers and control circuitry, that supports fast, dense matrix-matrix and matrix-vector operations.

Unfortunately, for CNNs executing on GPUs, DSPs, NPUs, etc., generic matrix multiply (GEMM) operations consume a significant number of processor cycles due to the large number of multiplications that are required.

Embodiments of the present disclosure advantageously provide a complex Winograd convolution that accelerates convolution layer calculations for a CNN, and, more particularly, for a quantized CNN. Additionally, the number of general multiplications in the complex Winograd convolution have been reduced, which yields an arithmetic reduction of about 3× and an efficiency gain of about 16% to 17% over standard (i.e., non-complex) Winograd convolutions.

The Winograd convolution outperforms the standard convolution for "short" convolutions, as measured by the number of general multiplications. The Winograd convolution defines a polynomial over a field F as a mathematical expression given by EQ. 1:

$$f(x) = f_n x^n + f_{n-1} x^{n-1} + \ldots + f_1 x + f_0 \qquad \text{EQ. 1}$$

where x is symbolic and $f_0, \ldots, f_n$ are elements of the field F known as the coefficients. Linear and cyclic convolutions are then formulated as polynomial products; a linear convolution is given by $s(x)=g(x)d(x)$, while a cyclic convolution is given by $s(x)=g(x)d(x) \pmod{x^n-1}$.

Convolutions may be formulated using the Lagrange interpolation or the Chinese remainder theorem (CRT) for polynomials. The Winograd convolution calculates $s(x)=g(x)d(x) \pmod{m(x)}$, where $m(x)$, $g(x)$ and $d(x)$ are polynomials in F. The linear and cyclic convolutions may also be cast to this format. For example, setting $m(x)=x^n-1$ yields the cyclic convolution, which factors $m(x)$ into pairwise coprime polynomials $m^{(k)}(x)$ over a subfield of F, and constructs the solution using the CRT or interpolation.

For example, let $F(m,r)$ denote the computation of m outputs with an r-tap FIR filter. $F(m,r)$ consumes $m+r-1$ input values, the same number of general multiplications for the Winograd algorithm. The matrix form is given by EQ. 2:

$$Y = A^T [(Gg) \odot (B^T d)] \qquad \text{EQ. 2}$$

where $\odot$ represents element-wise multiplication (also known as the Hadamard product), g is the filter matrix, d is the input matrix, and $B^T$, G, and $A^T$ are the transform matrices.

Higher dimensional computations $F(m \times n, r \times s)$ may be formulated by nesting the corresponding 1D algorithms $F(m,r)$ and $F(n,s)$ along each dimension. Square-shaped filters and activation patches are common, particularly in CNNs, and a 2D computation $F(m \times m, r \times r)$ is given by EQ. 3:

$$Y = A^T [(GgG^T) \odot (B^T dB)] A \qquad \text{EQ. 3}$$

whose arithmetic complexity reduction is given by EQ. 4:

$$\frac{m^2 r^2}{(m+r-1)^2} \qquad \text{EQ. 4}$$

Two commonly-used computations are $F(2 \times 2, 3 \times 3)$ and $F(4 \times 4, 3 \times 3)$, which achieve reductions of 2.25× and 4×, respectively. In order to avoid additional general multiplications, other than those in the Hadamard product $\odot$, good interpolation points should be used in the derivation of Winograd convolutions. For $F(2,3)$, three interpolation points, e.g., [0, 1, −1], are used to generate the transform matrices that involve only additions, subtractions, and shifts by 1 bit. For $F(4 \times 4, 3 \times 3)$, five interpolation points, e.g., [0, 1, −1, 2, −2] are used to generate the transform matrices, and the filter transform matrix G is given by EQ. 5:

$$G = \begin{bmatrix} \frac{1}{4} & 0 & 0 \\ -\frac{1}{6} & -\frac{1}{6} & -\frac{1}{6} \\ -\frac{1}{6} & \frac{1}{6} & -\frac{1}{6} \\ \frac{1}{24} & \frac{1}{12} & \frac{1}{6} \\ \frac{1}{24} & -\frac{1}{12} & \frac{1}{6} \\ 0 & 0 & 1 \end{bmatrix} \qquad \text{EQ. 5}$$

However, G and its transpose $G^T$ cause significant performance overhead for hardware accelerators designed with integer arithmetic for quantized neural networks, such as quantized CNNs. Both G and $G^T$ contain the large denominator 24 in its fractional values, and must to be scaled up accordingly for full-precision integer arithmetic. This requires widening the w-bit spatial domain filter by at least $[\log_2(24^2)]=10$ bits when it is transformed into the Winograd domain with G and $G^T$, resulting in a significant area increase for any custom integer multipliers that compute the element-wise multiplications in the Winograd domain.

Only the field of rationals Q has been used as the subfield of F in the derivation of Winograd convolutions for CNN acceleration. Due to the undesirable numerical properties, most integer-based hardware accelerators designed with Winograd convolutions are limited to using $F(2 \times 2, 3 \times 3)$ with only 2.25× complexity reduction and its 1D variants.

Figure 4A:
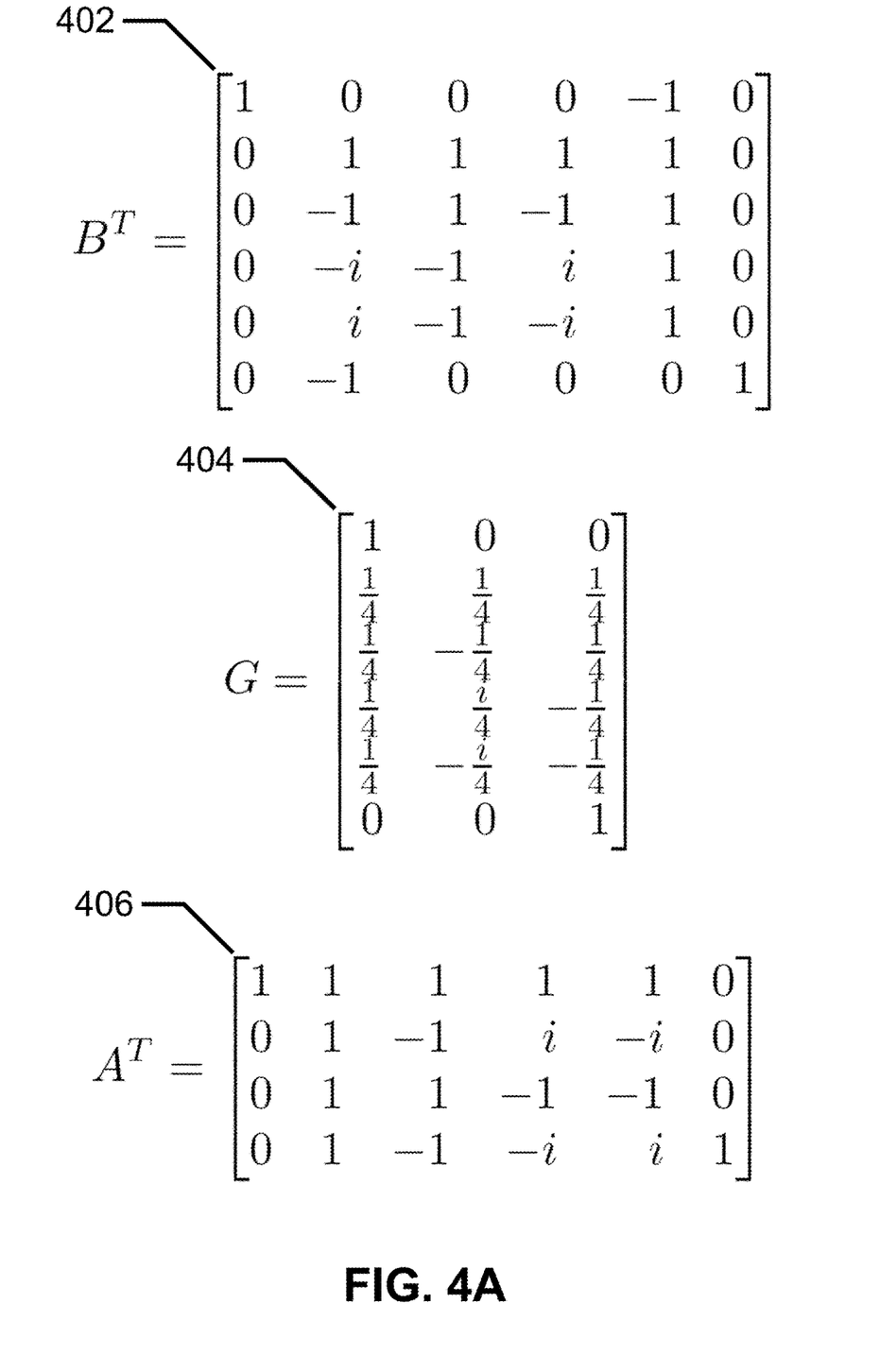
FIG. 4A depicts a set of complex transform matrices, in accordance with an embodiment of the present disclosure.

Advantageously, embodiments of the present disclosure provide a complex Winograd convolution that extends the subfield of F from Q to the complex field C. While each multiplication in C takes four multiplications when implemented simply or three multiplications using the Karatsuba method, the complex Winograd convolution nevertheless improves the performance of the convolutional layer of a CNN. In many embodiments, a complex $F(4 \times 4, 3 \times 3)$ is used, which replaces the standard interpolation points of [0, 1, −1, 2, −2] in with the complex interpolation points of [0, 1, −1, i, −i] in C, where i is the imaginary unit. Using the same construction technique as in, the complex transform matrices for $F(4 \times 4, 3 \times 3)$ are $B^T$, G, and $A^T$. FIG. 4A depicts a set of complex transform matrices, $B^T$ matrix 402, G matrix 404, and $A^T$ matrix 406, in accordance with an embodiment of the present disclosure.

Through the use of symmetric interpolation points in the complex plane, the magnitudes of elements in all three transform matrices, i.e., $B^T$, G and $A^T$, have been reduced. $B^T$ and $A^T$ now only involve additions and subtractions, and the largest denominator in G has been reduced from 24 to 4.

Additionally, the arithmetic complexity reduction of the complex Winograd convolution reduces area and improves efficiency for integer arithmetic. One embodiment provides an optimization technique that reduces the number of complex multiplications by exploiting the underlying complex conjugate pairs. In other words, once $x=a+bi$ has been determined, then no additional multiplication is needed for its complex conjugate $\bar{x}=a-bi$.

For example, the matrix product $B^T d B$ may be expressed as $d=[d_{i,j}]$ for $i,j \in [0, 1, 2, 3, 4, 5]$, $d'=B^T d$, and $D=d'B$, then, for $j=[0, 1, 2, 3, 4, 5]$, $d'[i,j]$ is given by EQ. 6:

$$d'[0, j] = d_{0,j} - d_{4,j} \qquad \text{EQ. 6}$$

$$d'[1, j] = \sum_{k=1}^{4} d_{k,j}$$

$$d'[2, j] = -d_{i,j} + d_{2,j} - d_{3,j} + d_{4,j}$$

$$d'[3, j] = -d_{2,j} + d_{4,j} - (d_{1,j} - d_{3,j})i$$

$$d'[4, j] = -d_{2,j} + d_{4,j} + (d_{1,j} - d_{3,j})i$$

$$d'[5, j] = -d_{1,j} + d_{5,j}.$$

Figure 4B:
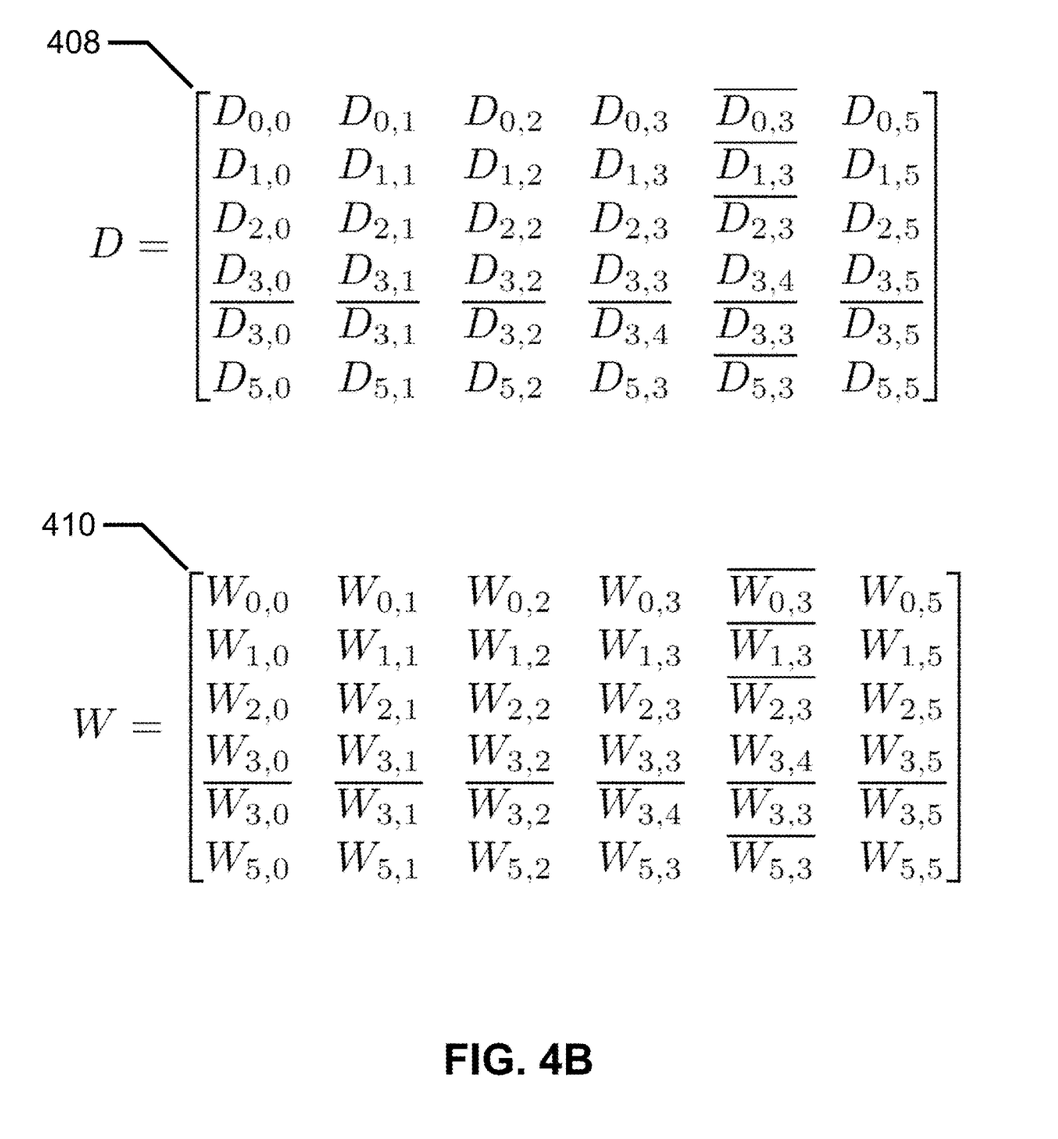
FIG. 4B depicts a set of complex matrices, in accordance with an embodiment of the present disclosure.

The [0, 1, 2, 5] rows contain only additions and subtractions among the input values, while the [3, 4] rows contain pairs of complex conjugates. The same complex conjugate pattern can be found in the [3, 4] columns in D after d' is right multiplied with B. Composing the patterns in rows of $B^T$ and columns of B, D'' contains the complex conjugate pairs. That is, the 6×6 transformed activation contains 10 pairs of complex conjugates and the other 16 values in The same pattern can be found in the transformed filter $W=GgG^T$ by noticing the rows [3, 4] in G are structurally the same as those in $B^T$, in terms of producing complex conjugate pairs. FIG. 4B depicts a set of complex matrices, D matrix 408 and W matrix 410, in accordance with an embodiment of the present disclosure.

In 2D form, the complex Winograd convolution is given by EQ. 7:

$$Y = A^T[(GgG^T) \odot (B^T dB)]A \qquad \text{EQ. 7}$$
$$= A^T[W \odot D]A$$

Only the Hadamard product W⊙D contains general multiplications. Furthermore, the complex values and their conjugates are located at matching positions in D and W. The 16 pairs of rational elements, such as $\{D_{0,0}, W_{0,0}\}$, require 16 general multiplications, while the 20 complex multiplications can be grouped into 10 pairs of complex conjugate multiplications, such as $\{\{D_{0,3}, W_{0,3}\}, \{\overline{D_{0,3}}, \overline{W_{0,3}}\}\}$. Since $\overline{x} \cdot \overline{y} = \overline{x \cdot y}$, each set requires only one complex multiplication. Using the Karatsuba algorithm described in more detail below, each complex multiplication takes 3 real multiplications. Therefore, the complex F(4×4,3×3) performs a total of 16+10×3=46 general multiplications, leading to an arithmetic complexity reduction of 144/46=3.13×, as measured by the number of general multiplications.

As discussed above, the complex Winograd convolution also provides efficiency gains on hardware accelerators. For example, while bit-width for the F(4×4,3×3) in with 4× reduction has to be widened by 10 bits (i.e., $[\log_2(24^2)]$), the bit-width for the complex F(4×4,3×3) in C only needs to be widened by 4 bits (i.e., $[\log_2(4^2)]$). For spatial filters having a bit-width of 8 bits in quantized CNNs, using the complex F(4×4,3×3) instead of its rational counterpart reduces the bit-width by about 33%, as given by EQ. 8, and achieves an efficiency gain with respect to the bit-width of about 17%, as given by EQ. 9:

$$1 - \frac{8+4}{8+10} = 33.33\% \qquad \text{EQ. 8}$$

$$\frac{3.13/12}{4.0/18} - 1 = 17.37\% \qquad \text{EQ. 9}$$

Compared to the rational F(2×2,3×3), the efficiency gain is about 16%, as given by EQ. 10:

$$\frac{3.13/(8+4)}{2.25/(8+2)} - 1 = 15.93\% \qquad \text{EQ. 10}$$

Additional optimizations include keeping the Hadamard product in the Karatsuba format if the products are summed across multiple channels, and skipping the calculations for the imaginary coefficients in the final results because they will sum to 0 due to the original computation of convolving two integer tensors g and d.

The Karatsuba method multiplies two n-digit numbers using at most $n^{\log_2 3} \approx n^{1.585}$ single-digit multiplications in general. For example, for two n-digit numbers X and Y in some base B, the basic step of Karatsuba method computes the product of X and Y using three multiplications and some additions and shifts. For m be any positive integer less than n, X and Y are given by EQ. 11:

$$X = x_0 + x_1 B^m, Y = y_0 + y_1 B^m \qquad \text{EQ. 11}$$

where $x_0$ and $y_0$ are the remainders of X and Y modulo $B^m$, and $x_1$ and $y_1$ are the quotients, respectively. The product of X and Y is given by EQ. 12:

$$XY = x_0 y_0 + (x_1 y_0 + x_0 y_1) B^m + x_1 y_1 B^{2m} \qquad \text{EQ. 12}$$

The coefficient of $B^m$ is given by EQ. 13:

$$(x_1 y_0 + x_0 y_1) = (x_1 + x_0)(y_1 + y_0) - x_1 y_1 - x_0 y_0 \qquad \text{EQ. 13}$$

which reuses $x_1 y_1$ and $x_0 y_0$, leading to a multiplication of X and Y with three multiplications instead of four.

Embodiments of the present disclosure adapt the Karatsuba method to the complex Winograd convolution, where the base B is replaced with the imaginary unit i. The product of $X = x_0 + x_1 \cdot i$ and $Y = y_0 + y_1 \cdot i$ is given by EQ. 14:

$$\left(\underbrace{x_0 y_0}_{mul\,1} - \underbrace{x_1 y_1}_{mul\,2}\right) + \left(\underbrace{(x_1 + x_0)(y_1 + y_0)}_{mul\,3} - x_1 y_1 - x_0 y_0\right) \cdot i \qquad \text{EQ. 14}$$

Figure 5:
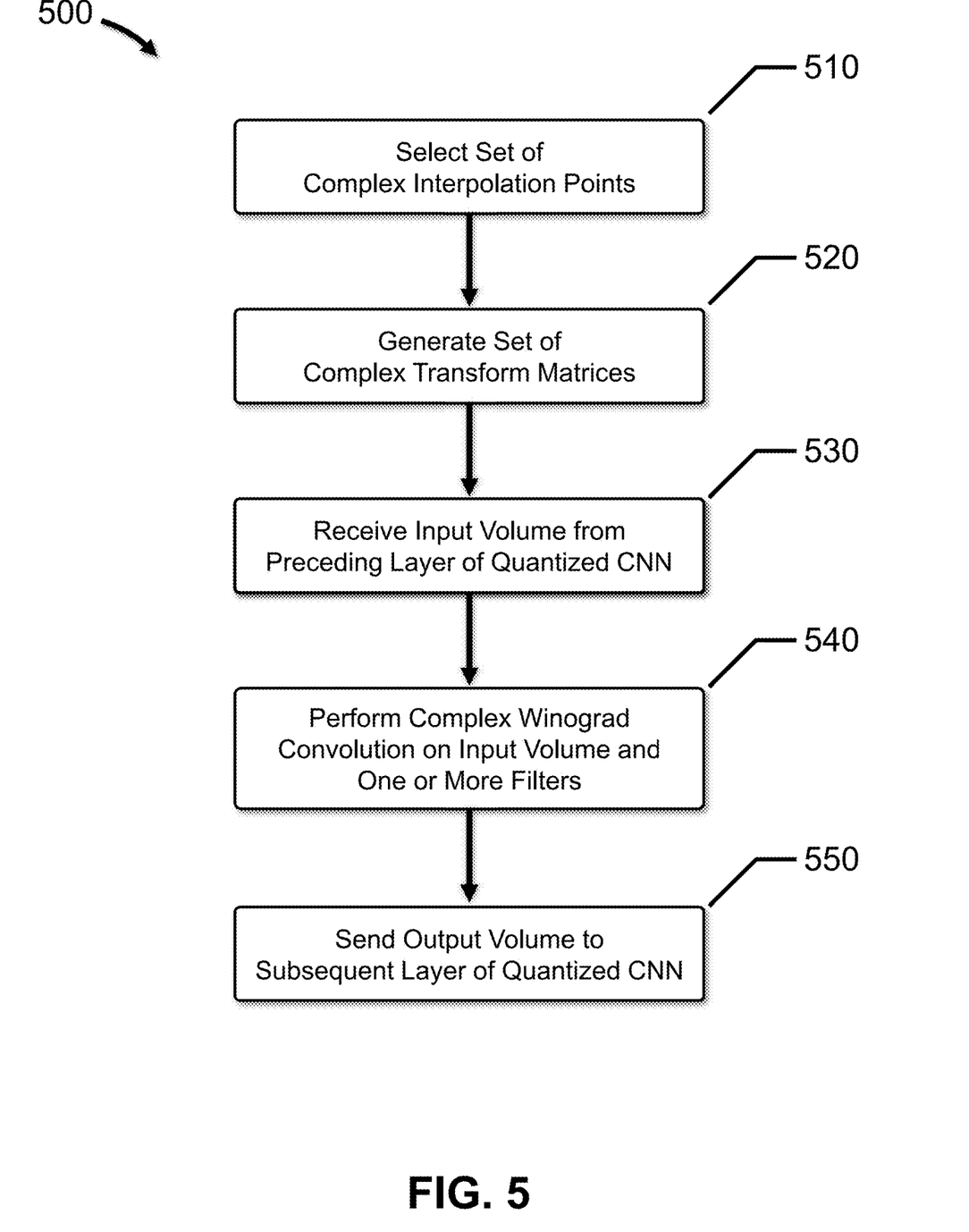
FIG. 5 depicts a flow diagram presenting functionality for convolving data in a quantized CNN, in accordance with embodiments of the present disclosure.

FIG. 5 depicts flow diagram 500 presenting functionality for convolving data in a quantized CNN, in accordance with an embodiment of the present disclosure.

At 510, a set of complex interpolation points are selected. In one embodiment, the set of complex interpolation points is symmetric and includes at least one of 0, 1 or −1, and at least one of i or −i. In a further embodiment, the set of interpolation points includes [0, 1, −1,].

At 520, a set of complex transform matrices is generated based, at least in part, on the set of complex interpolation points.

At 530, an input volume is received from a preceding layer of the quantized CNN. The input volume includes an input width, an input height, an input depth and a plurality of quantized values. The input depth is equal to a number of input channels.

At 540, a complex Winograd convolution is performed on the input volume and at least one filter, using the set of complex transform matrices, to generate an output volume. Each filter includes a filter width, a filter height, a filter depth and a plurality of filter values. The output volume includes an output width, an output height, an output depth and a plurality of quantized values. The output depth is equal to the number of filters.

At 550, the output volume is sent to a subsequent layer of the quantized CNN.

Embodiments of the present disclosure advantageously provide a system and a method for convolving data in a quantized CNN. The embodiments described above and summarized below are combinable.

In one embodiment, a system includes a memory configured to store input data, a processor coupled to the memory, and a hardware accelerator, coupled to the processor and the memory. The processor is configured to select a set of complex interpolation points, and generate a set of complex transform matrices based, at least in part, on the set of complex interpolation points. The hardware accelerator is configured to receive an input volume from a preceding layer of a quantized convolutional neural network (CNN), the input volume including an input width, an input height, an input depth and a plurality of quantized values, the input depth being equal to a number of input channels; perform a complex Winograd convolution on the input volume and at least one filter, using the set of complex transform matrices, to generate an output volume, each filter including a filter width, a filter height, a filter depth and a plurality of filter values, the output volume including an output width, an output height, an output depth and a plurality of quantized values, the output depth being equal to a number of filters; and send the output volume to a subsequent layer of the quantized CNN.

In another embodiment, a method for convolving data in a quantized convolutional neural network (CNN) includes selecting a set of complex interpolation points; generating a set of complex transform matrices based, at least in part, on the set of complex interpolation points; receiving an input volume from a preceding layer of the quantized CNN, the input volume including an input width, an input height, an input depth and a plurality of quantized values, the input depth being equal to a number of input channels; performing a complex Winograd convolution on the input volume and at least one filter, using the set of complex transform matrices, to generate an output volume, each filter including a filter width, a filter height, a filter depth and a plurality of filter values, the output volume including an output width, an output height, an output depth and a plurality of quantized values, the output depth being equal to a number of filters; and sending the output volume to a subsequent layer of the quantized CNN.

In one embodiment, the filter width equals r, the filter height equals r, and performing the complex Winograd convolution includes dividing each input channel into a plurality of input tiles, each input tile having a tile width equal to m+r−1, and a tile height equal to m+r−1; for each input channel, applying the respective filter to each input tile based on a function F(m×m, r×r) to generate an output matrix, where each output matrix has m×m elements; and summing the respective output matrices for each channel to generate the output volume.

In one embodiment, the function F(m×m,r×r) is given by $Y=A^T[(GgG^T)\odot(B^TdB)]A$, where Y is the output matrix, g is the filter, d is an input tile, $B^T$, G and $A^T$ form the set of complex transform matrices, and $\odot$ is an element-by-element multiplication.

In one embodiment, the set of complex interpolation points is symmetric and includes at least one of 0, 1 or −1, and at least one of i or −i.

In one embodiment, m equals 4, r equals 3, and the set of complex interpolation points includes [0, 1, −1, i, −i].

In one embodiment, $$B^T = \begin{bmatrix} 1 & 0 & 0 & 0 & -1 & 0 \\ 0 & 1 & 1 & 1 & 1 & 0 \\ 0 & -1 & 1 & -1 & 1 & 0 \\ 0 & -i & -1 & i & 1 & 0 \\ 0 & i & -1 & -i & 1 & 0 \\ 0 & -1 & 0 & 0 & 0 & 1 \end{bmatrix},$$

$$G = \begin{bmatrix} 1 & 0 & 0 \\ \frac{1}{4} & \frac{1}{4} & \frac{1}{4} \\ \frac{1}{4} & \frac{-1}{4} & \frac{1}{4} \\ \frac{1}{4} & \frac{i}{4} & \frac{-1}{4} \\ \frac{1}{4} & \frac{-i}{4} & \frac{-1}{4} \\ 0 & 0 & 1 \end{bmatrix}, \text{ and}$$

$$A^T = \begin{bmatrix} 1 & 1 & 1 & 1 & 1 & 0 \\ 0 & 1 & -1 & i & -i & 0 \\ 0 & 1 & 1 & -1 & -1 & 0 \\ 0 & 1 & -1 & -i & i & 1 \end{bmatrix}.$$

In one embodiment, the function F(m×m,r×r) is given by $Y=A^T[W\odot D]A$, where W is $GgG^T$, D is $B^T_QB$, and W and D include real elements and complex conjugate pairs.

In one embodiment, $$W = \begin{bmatrix} W_{0,0} & W_{0,1} & W_{0,2} & W_{0,3} & \overline{W_{0,3}} & W_{0,5} \\ W_{1,0} & W_{1,1} & W_{1,2} & W_{1,3} & \overline{W_{1,3}} & W_{1,5} \\ W_{2,0} & W_{2,1} & W_{2,2} & W_{2,3} & \overline{W_{2,3}} & W_{2,5} \\ W_{3,0} & W_{3,1} & W_{3,2} & W_{3,3} & W_{3,4} & W_{3,5} \\ \overline{W_{3,0}} & \overline{W_{3,1}} & \overline{W_{3,2}} & \overline{W_{3,4}} & \overline{W_{3,3}} & \overline{W_{3,5}} \\ W_{5,0} & W_{5,1} & W_{5,2} & W_{5,3} & \overline{W_{5,3}} & W_{5,5} \end{bmatrix}, \text{ and}$$

$$D = \begin{bmatrix} D_{0,0} & D_{0,1} & D_{0,2} & D_{0,3} & \overline{D_{0,3}} & D_{0,5} \\ D_{1,0} & D_{1,1} & D_{1,2} & D_{1,3} & \overline{D_{1,3}} & D_{1,5} \\ D_{2,0} & D_{2,1} & D_{2,2} & D_{2,3} & \overline{D_{2,3}} & D_{2,5} \\ D_{3,0} & D_{3,1} & D_{3,2} & D_{3,3} & D_{3,4} & D_{3,5} \\ \overline{D_{3,0}} & \overline{D_{3,1}} & \overline{D_{3,2}} & \overline{D_{3,4}} & \overline{D_{3,3}} & \overline{D_{3,5}} \\ D_{5,0} & D_{5,1} & D_{5,2} & D_{5,3} & \overline{D_{5,3}} & D_{5,5} \end{bmatrix}.$$

In one embodiment, the hardware accelerator is further configured to compute each complex conjugate pair using a Karatsuba multiplication given by:

$$(x_0+x_1i)(y_0+y_1i)=(x_0y_0-x_1y_1)+((x_1+x_0)(y_1+y_0)-x_1y_1-x_0y_0)\cdot i.$$

In one embodiment, the quantized values include integer values, reduced precision floating point values, or fixed point values, and the hardware accelerator is further configured to select a first complex conjugate of a complex conjugate pair; and generate a second complex conjugate of the complex conjugate pair by changing a sign of an imaginary portion of the first complex conjugate to an opposite sign.

In a further embodiment, a hardware accelerator is configured to receive an input volume from a preceding layer of a quantized convolutional neural network (CNN), the input volume including an input width, an input height, an input depth and a plurality of quantized values, the input depth being equal to a number of input channels; perform a complex Winograd convolution on the input volume and at least one filter, using a set of complex transform matrices, to generate an output volume, each filter including a filter width, a filter height, a filter depth and a plurality of filter values, the output volume including an output width, an output height, an output depth and a plurality of quantized values, the output depth being equal to a number of filters; and send the output volume to a subsequent layer of the quantized CNN.

While implementations of the disclosure are susceptible to embodiment in many different forms, there is shown in the drawings and will herein be described in detail specific embodiments, with the understanding that the present disclosure is to be considered as an example of the principles of the disclosure and not intended to limit the disclosure to the specific embodiments shown and described. In the description above, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," "for example," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus, device, system, etc. may be used interchangeably in this text.

The many features and advantages of the disclosure are apparent from the detailed specification, and, thus, it is intended by the appended claims to cover all such features and advantages of the disclosure which fall within the scope of the disclosure. Further, since numerous modifications and variations will readily occur to those skilled in the art, it is not desired to limit the disclosure to the exact construction and operation illustrated and described, and, accordingly, all suitable modifications and equivalents may be resorted to that fall within the scope of the disclosure.

What is claimed is:

1. A system, comprising:
a memory configured to store input data;
a processor, coupled to the memory, configured to:
   select a set of complex interpolation points, and
   generate a set of complex transform matrices based, at least in part, on the set of complex interpolation points;
a hardware accelerator, coupled to the processor and the memory, configured to:
   receive an input volume from a preceding layer of a quantized convolutional neural network (CNN), the input volume including an input width, an input height, an input depth and a plurality of quantized values, the input depth being equal to a number of input channels;
   perform a complex Winograd convolution on the input volume and one or more filters, using the set of complex transform matrices, to generate an output volume, each of the one or more filters including a filter width, a filter height, a filter depth and a plurality of filter values, the output volume including an output width, an output height, an output depth and a plurality of quantized values, the output depth being equal to a number of the one or more filters; and send the output volume to a subsequent layer of the quantized CNN.

2. The system of claim 1, where the filter width equals r, the filter height equals r, and said perform the complex Winograd convolution includes:

divide each input channel into a plurality of input tiles, each input tile having a tile width equal to m+r−1, and a tile height equal to m+r−1;

for each input channel, apply the respective filter to each input tile based on a function F(m×m,r×r) to generate an output matrix, where each output matrix has m×m elements; and sum the respective output matrices for each channel to generate the output volume.

3. The system of claim 2, where the function F(m×m,r×r) is given by $Y=A^T[(GgG^T)\odot(B^TdB)]A$, where Y is the output matrix, g is the filter, d is an input tile, $B^T$, G and $A^T$ form the set of complex transform matrices, and $\odot$ is an element-by-element multiplication.

4. The system of claim 3, where the set of complex interpolation points is symmetric and includes at least one of 0, 1 or −1, and at least one of i or −i.

5. The system of claim 4, where m equals 4, r equals 3, and the set of complex interpolation points includes [0, 1, −1, i, −i].

6. The system of claim 5, where:

$$B^T = \begin{bmatrix} 1 & 0 & 0 & 0 & -1 & 0 \\ 0 & 1 & 1 & 1 & 1 & 0 \\ 0 & -1 & 1 & -1 & 1 & 0 \\ 0 & -i & -1 & i & 1 & 0 \\ 0 & i & -1 & -i & 1 & 0 \\ 0 & -1 & 0 & 0 & 0 & 1 \end{bmatrix},$$

$$G = \begin{bmatrix} 1 & 0 & 0 \\ \frac{1}{4} & \frac{1}{4} & \frac{1}{4} \\ \frac{1}{4} & \frac{-1}{4} & \frac{1}{4} \\ \frac{1}{4} & \frac{i}{4} & \frac{-1}{4} \\ \frac{1}{4} & \frac{-i}{4} & \frac{-1}{4} \\ 0 & 0 & 1 \end{bmatrix}, \text{ and}$$

$$A^T = \begin{bmatrix} 1 & 1 & 1 & 1 & 1 & 0 \\ 0 & 1 & -1 & i & -i & 0 \\ 0 & 1 & 1 & -1 & -1 & 0 \\ 0 & 1 & -1 & -i & i & 1 \end{bmatrix}.$$

7. The system of claim 3, where the function F(m×m,r×r) is given by $Y=A^T[W\odot D]A$, where W is $GgG^T$, D is $B^TdB$, and W and D include real elements and complex conjugate pairs.

8. The system of claim 7, where:

$$W = \begin{bmatrix} W_{0,0} & W_{0,1} & W_{0,2} & W_{0,3} & \overline{W_{0,3}} & W_{0,5} \\ W_{1,0} & W_{1,1} & W_{1,2} & W_{1,3} & \overline{W_{1,3}} & W_{1,5} \\ W_{2,0} & W_{2,1} & W_{2,2} & W_{2,3} & \overline{W_{2,3}} & W_{2,5} \\ W_{3,0} & W_{3,1} & W_{3,2} & W_{3,3} & W_{3,4} & W_{3,5} \\ \overline{W_{3,0}} & \overline{W_{3,1}} & \overline{W_{3,2}} & \overline{W_{3,4}} & \overline{W_{3,3}} & \overline{W_{3,5}} \\ W_{5,0} & W_{5,1} & W_{5,2} & W_{5,3} & \overline{W_{5,3}} & W_{5,5} \end{bmatrix}, \text{ and}$$

$$D = \begin{bmatrix} D_{0,0} & D_{0,1} & D_{0,2} & D_{0,3} & \overline{D_{0,3}} & D_{0,5} \\ D_{1,0} & D_{1,1} & D_{1,2} & D_{1,3} & \overline{D_{1,3}} & D_{1,5} \\ D_{2,0} & D_{2,1} & D_{2,2} & D_{2,3} & \overline{D_{2,3}} & D_{2,5} \\ D_{3,0} & D_{3,1} & D_{3,2} & D_{3,3} & D_{3,4} & D_{3,5} \\ \overline{D_{3,0}} & \overline{D_{3,1}} & \overline{D_{3,2}} & \overline{D_{3,4}} & \overline{D_{3,3}} & \overline{D_{3,5}} \\ D_{5,0} & D_{5,1} & D_{5,2} & D_{5,3} & \overline{D_{5,3}} & D_{5,5} \end{bmatrix}.$$

9. The system of claim 8, where the hardware accelerator is further configured to compute each complex conjugate pair using a Karatsuba multiplication given by:

$(x_0+x_1i)(y_0+y_1i)=(x_0y_0-x_1y_1)+((x_1+x_0)(y_1+y_0)-x_1y_1-x_0y_0)\cdot i.$ 10. The system of claim 9, where the quantized values include integer values, reduced precision floating point values, or fixed point values, and the hardware accelerator is further configured to:

select a first complex conjugate of a complex conjugate pair; and generate a second complex conjugate of the complex conjugate pair by changing a sign of an imaginary portion of the first complex conjugate to an opposite sign.

11. A method for convolving data in a quantized convolutional neural network (CNN), comprising:

selecting a set of complex interpolation points;

generating a set of complex transform matrices based, at least in part, on the set of complex interpolation points;

receiving an input volume from a preceding layer of the quantized CNN, the input volume including an input width, an input height, an input depth and a plurality of quantized values, the input depth being equal to a number of input channels;

performing a complex Winograd convolution on the input volume and at least one filter, using the set of complex transform matrices, to generate an output volume, each filter including a filter width, a filter height, a filter depth and a plurality of filter values, the output volume including an output width, an output height, an output depth and a plurality of quantized values, the output depth being equal to a number of filters; and sending the output volume to a subsequent layer of the quantized CNN.

12. The method of claim 11, where the filter width equals r, the filter height equals r, and performing the complex Winograd convolution includes:

dividing each input channel into a plurality of input tiles, each input tile having a tile width equal to m+r−1, and a tile height equal to m+r−1;

for each input channel, applying the respective filter to each input tile based on a function F(m×m, r×r) to generate an output matrix, where each output matrix has m×m elements; and summing the respective output matrices for each channel to generate the output volume.

13. The method of claim 12, where the function F(m×m, r×r) is given by $Y=A^T[(GgG^T) \odot (B^TdB)]A$, where Y is the output matrix, g is the filter, d is an input tile, $B^T$, G and $A^T$ form the set of complex transform matrices, and $\odot$ is an element-by-element multiplication.

14. The method of claim 13, where the set of complex interpolation points is symmetric and includes at least one of 0, 1 or −1, and at least one of i or −i.

15. The method of claim 14, where m equals 4, r equals 3, and the set of complex interpolation points includes [0, 1, −1, i, −i].

16. The method of claim 15, where:

$$B^T = \begin{bmatrix} 1 & 0 & 0 & 0 & -1 & 0 \\ 0 & 1 & 1 & 1 & 1 & 0 \\ 0 & -1 & 1 & -1 & 1 & 0 \\ 0 & -i & -1 & i & 1 & 0 \\ 0 & i & -1 & -i & 1 & 0 \\ 0 & -1 & 0 & 0 & 0 & 1 \end{bmatrix},$$

$$G = \begin{bmatrix} 1 & 0 & 0 \\ \frac{1}{4} & \frac{1}{4} & \frac{1}{4} \\ \frac{1}{4} & \frac{-1}{4} & \frac{1}{4} \\ \frac{1}{4} & \frac{i}{4} & \frac{-1}{4} \\ \frac{1}{4} & \frac{-i}{4} & \frac{-1}{4} \\ 0 & 0 & 1 \end{bmatrix}, \text{ and}$$

$$A^T = \begin{bmatrix} 1 & 1 & 1 & 1 & 1 & 0 \\ 0 & 1 & -1 & i & -i & 0 \\ 0 & 1 & 1 & -1 & -1 & 0 \\ 0 & 1 & -1 & -i & i & 1 \end{bmatrix}.$$

17. The method of claim 13, where the function F(m×m, r×r) is given by $Y=A^T[W \odot D]A$, where W is $GgG^T$, D is $B^TdB$, and W and D include real elements and complex conjugate pairs.

18. The method of claim 17, where:

$$W = \begin{bmatrix} W_{0,0} & W_{0,1} & W_{0,2} & W_{0,3} & \overline{W_{0,3}} & W_{0,5} \\ W_{1,0} & W_{1,1} & W_{1,2} & W_{1,3} & \overline{W_{1,3}} & W_{1,5} \\ W_{2,0} & W_{2,1} & W_{2,2} & W_{2,3} & \overline{W_{2,3}} & W_{2,5} \\ W_{3,0} & W_{3,1} & W_{3,2} & W_{3,3} & W_{3,4} & W_{3,5} \\ \overline{W_{3,0}} & \overline{W_{3,1}} & \overline{W_{3,2}} & \overline{W_{3,4}} & \overline{W_{3,3}} & \overline{W_{3,5}} \\ W_{5,0} & W_{5,1} & W_{5,2} & W_{5,3} & \overline{W_{5,3}} & W_{5,5} \end{bmatrix}, \text{ and}$$

$$D = \begin{bmatrix} D_{0,0} & D_{0,1} & D_{0,2} & D_{0,3} & \overline{D_{0,3}} & D_{0,5} \\ D_{1,0} & D_{1,1} & D_{1,2} & D_{1,3} & \overline{D_{1,3}} & D_{1,5} \\ D_{2,0} & D_{2,1} & D_{2,2} & D_{2,3} & \overline{D_{2,3}} & D_{2,5} \\ D_{3,0} & D_{3,1} & D_{3,2} & D_{3,3} & D_{3,4} & D_{3,5} \\ \overline{D_{3,0}} & \overline{D_{3,1}} & \overline{D_{3,2}} & \overline{D_{3,4}} & \overline{D_{3,3}} & \overline{D_{3,5}} \\ D_{5,0} & D_{5,1} & D_{5,2} & D_{5,3} & \overline{D_{5,3}} & D_{5,5} \end{bmatrix}.$$

19. The method of claim 18, where the quantized values include integer values, reduced precision floating point values, or fixed point values, the method further comprising:
computing each complex conjugate pair using a Karatsuba multiplication given by $(x_0+x_1 i)(y_0+y_1 i)=(x_0 y_0 - x_1 y_1)+((x_1+x_0)(y_1+y_0)-x_1 y_1 - x_0 y_0) \cdot i$;
selecting a first complex conjugate of a complex conjugate pair; and
generating a second complex conjugate of the complex conjugate pair by changing a sign of an imaginary portion of the first complex conjugate to an opposite sign.

20. A system, comprising:
a hardware accelerator configured to:
receive an input volume from a preceding layer of a quantized convolutional neural network (CNN), the input volume including an input width, an input height, an input depth and a plurality of quantized values, the input depth being equal to a number of input channels;
perform a complex Winograd convolution on the input volume and at least one filter, using a set of complex transform matrices, to generate an output volume, each filter including a filter width, a filter height, a filter depth and a plurality of filter values, the output volume including an output width, an output height, an output depth and a plurality of quantized values, the output depth being equal to a number of filters; and
send the output volume to a subsequent layer of the quantized CNN.

* * * * *